United States Patent [19]

Cusano

[11] 4,015,028
[45] Mar. 29, 1977

[54] METHOD FOR FORMING AN IMPROVED CONTACT FOR A RADIATION SWITCH

[75] Inventor: Dominic A. Cusano, Schenectady, N.Y.

[73] Assignee: General Electric Company, Schenectady, N.Y.

[22] Filed: Oct. 20, 1975

[21] Appl. No.: 623,586

Related U.S. Application Data

[62] Division of Ser. No. 490,585, July 22, 1974, Pat. No. 3,944,961.

[52] U.S. Cl. .................................. 427/58; 427/125; 427/126; 427/264; 427/270; 427/277; 427/355; 427/356; 427/357; 29/622
[51] Int. Cl.$^2$ ...................... B05D 3/12; B05D 5/12
[58] Field of Search ............... 337/15, 17, 19, 125, 337/221, 389, 413–416; 219/504, 505; 200/279, 289; 29/622; 427/58, 264, 270, 277, 356, 357, 126, 125, 355; 431/95

[56] References Cited

UNITED STATES PATENTS

| | | | |
|---|---|---|---|
| 1,347,735 | 7/1920 | Derby et al. | 337/415 |
| 2,383,567 | 8/1945 | Rudnick | 427/270 |
| 2,582,685 | 1/1952 | Eisler | 427/277 |
| 2,774,850 | 12/1956 | Ziccardi | 337/415 |
| 3,244,556 | 4/1966 | Mytych | 427/277 |
| 3,260,883 | 7/1966 | Martin | 337/19 |
| 3,458,270 | 7/1969 | Ganser | 431/95 |
| 3,725,743 | 4/1973 | Murayama | 427/270 |

Primary Examiner—Michael F. Esposito
Attorney, Agent, or Firm—Jack E. Haken; Joseph T. Cohen; Jerome C Squillaro

[57] ABSTRACT

The reliability of radiation switches is improved in accordance with this invention by mechanically modifying the contact members of the switch structure to reduce the heat sinking effectiveness of the switch contact members.

4 Claims, 7 Drawing Figures

METHOD FOR FORMING AN IMPROVED CONTACT FOR A RADIATION SWITCH

This is a division of application Ser. No. 490,585, filed July 22, 1974 now U.S. Pat. No. 3,944,961.

This invention relates to radiation switches. More particularly, this invention relates to improved contact members for radiation switches which provide for increased reliablility of the radiation switch by decreasing the effectiveness of the contact members as heat sinks.

Radiation switches are employed to detect radiation and to initiate a radiation responsive electrical event. Radiation switches typically comprise a pair of conductors having a gap therebetween and a quantity of metal precursor material overlying a portion of the conductors and the gap therebetween. The conductors in typical prior art radiation switches simultaneously serve as leads and contacts for the switches. One example of prior art radiation switches is shown in U.S. Pat. No. 3,458,270, issued to H. G. Ganser et al on July 29, 1969. The Ganser et al switches are used for photoflash lamp sequencing and comprise a pair of parallel conductors having a metal oxide, metal conductor precursor material therebetween. Other conductor configurations and other conductor precursor materials may be employed, as is known in the art. For example, the Ganser et al patent shows silver oxide as a conductor precursor material; silver oxalate, silver lactate, silver citrate, silver nitrate, silver carbonate, and silver chlorate are also known conductor precursor materials for radiation switch use. The Ganser et al reference shows parallel conductors with the conductor precursor material disposed between the conductors along the longitudinal runs of the conductors; it is also known to use collinear conductors having a gap between the ends thereof, which gap is covered by conductor precursor material to make a radiation switch. This invention is to be understood to be generally applicable to radiation switches formed of a conductor precursor material bridging a gap between conductors and is not limited in its applicability to any particular conductor configuration, any particular conductor precursor composition, or any particular utilization environment for the radiation switch. Thus, it is to be understood that the Ganser et al reference, hereinbefore cited, is cited merely as an example of prior radiation switch construction.

In general, radiation switches operate by the utilization of a conductor precursor material which is electrically nonconductive and which, when exposed to radiation of sufficient intensity, undergoes an exothermic reaction which converts the conductor precursor material into an electrically conductive material.

The exothermic reaction which converts conductor precursor material to electrically conductive material requires the maintenance of a minimum temperature for the reaction to continue to run. In prior art radiation switches, it has been found that the conductor members which form a part of the radiation switch and between which the conductor precursor material is applied function as thermal heat sinks to the extent that, in some cases, the temperature of the conductor precursor material undergoing conversion is reduced, in the neighborhood of the conductors, to be a point at which the reaction is extinguished. In these cases, the conductors are in contact with a quantity of unconverted conductor precursor material, which has a high electrical resistance, and which therefore prevents reliable operation of the switch.

It is accordingly, an object of this invention to provide an improved radiation switch which is highly reliable in operation.

It is another object of this invention to provide such a radiation switch in which the reliability is improved by decreasing the effectiveness of the switch contacts as heat sinks to thereby maintain a temperature which will permit the conductor precursor conversion reaction to run to completion.

It is another object of this invention to provide a radiation switch having such improved contacts in an inexpensive and simple manner.

Briefly, and in accordance with one embodiment of this invention, a radiation switch comprises a pair of conductors disposed on a substrate and having a gap between the conductors. A portion of each of the conductors serves as a switch contact. The switch contacts are provided with means for reducing the effectiveness thereof as heat sinks. A quantity of conductor precursor material is applied over the contacts and the portion of the substrate therebetween. The novel features of this invention sought to be patented are set forth with particularity in the appended claims. The invention, together with further objects and advantages thereof may be understood from a reading of the following specification and appended claims in view of the accompanying drawings in which:

Figure 1:
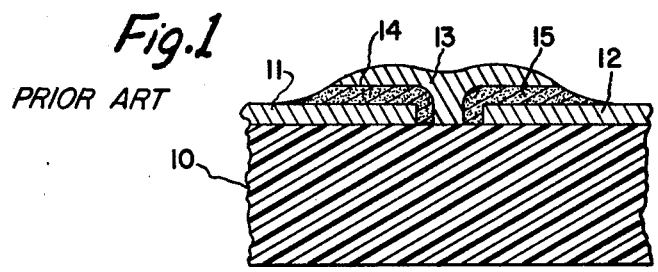
FIG. 1 is a sectional elevation view of a prior art radiation switch illustrating a failure mode associated with heat sinking by the conductor members.
Figure 7:
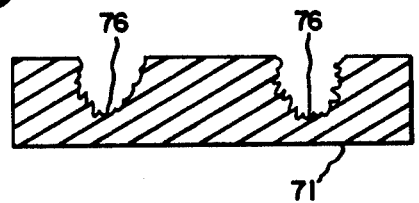

FIG. 7 is a sectional elevation view of a contact member for a radiation switch in accordance with this invention. FIG. 1 shows a prior art radiation switch comprising an insulating substrate 10 to which has been applied a pair of conductor members 11 and 12 having a gap therebetween. The fabrication of the radiation switch of FIG. 1 is completed by depositing a quantity of conductor precursor material over a portion of conductors 11 and 12, the gap therebetween, and the portion of substrate 10 underlying the gap between conductors 11 and 12. The conductor precursor material may, for example, be a silver salt in an organic binder which is electrically non-conductive and which, when excited by radiation, exothermically reacts to yield a conductor, for example, silver. The switch shown in FIG. 1 has been reacted. Accordingly, a quantity of the conductor precursor material has been converted to conductive material 13, for example, metallic silver in the example given. Conductors 11 and 12 serve as both leads and contacts for the radiation switch of FIG. 1. The portion of conductors 11 and 12 underlying the conductor precursor material are for convenience referred to as the switch contacts. Because conductors 11 and 12 are thermally conductive as well as electrically conductive, they serve as heat sinks tending to cool the portion of conductor precursor material in contact therewith during the conversion reaction. Because the conversion reaction is an exothermic reaction requiring the maintenance of a minimum temperature for the reaction to continue, heat sinking by conductors 11 and 12 has been found to cause extinguishment of the conversion reaction in the vicinity of the contacts leaving quantities 14 and 15 of unconverted, non-conductive, conductor precursor material intervening between metallic material 13 and conductors 11 and 12 thereby preventing proper operation of the radiation switch. The tendency of non-conductive regions 14 and 15 to remain after the firing of prior art radiation switches adversely affects the reliability of such radiation switches.

Figure 2:
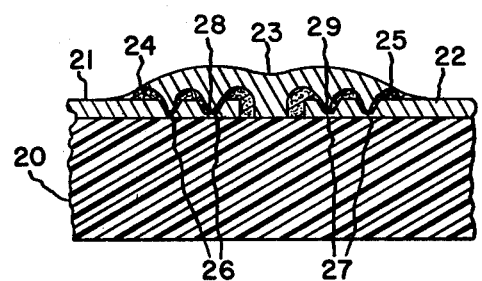
FIG. 2 is a sectional elevational view of a radiation switch in accordance with this invention and illustrating the operation thereof to provide improved reliability of switch operation.

FIG. 2 illustrates an improved radiation switch in accordance with this invention comprising a substrate 20 having conductors 21 and 22 applied thereto and having a gap therebetween. Conductors 21 and 22 have respectively grooves 26 and 27 in the contact regions thereof for decreasing the thermal conductivity of the conductor members at the groove locations to decrease the heat sinking effectiveness of the contact portions of the conductors. As heretofore described, the fabrication of the radiation switch of FIG. 2 is completed by depositing a quantity of conductor precursor material over the contact regions of conductors 21 and 22, the gap therebetween, and the portion of substrate 20 underlying the gap. As in the case of FIG. 1, the switch of FIG. 2 is shown in a fired condition in which a quantity of conductor precursor material has been converted to conductive material 23. Because of the reduced heat sinking effectiveness of the contact members of the switch, the temperature necessary to maintain the conversion reaction is maintained in the vicinity of grooves 26 and 27 and conductive material 23 is in contact with the contact portions of conductors 21 and 22, as, for example, shown at 28 and 29. Some unconverted conductor precursor material may remain after the firing of the switch of FIG. 2 as shown at 24 and 25, but because of the contact exemplified at 28 and 29, the switch operates properly and reliably.

The grooves in the contact members of radiation switches in accordance with this invention may be formed by any mechanical or chemical means known in the art, but are preferably formed by scribing. In particular, a deep scribing to a depth between 50 percent and 90 percent of the thickness of the conductor members is preferred. It is further also preferred to utilize a vibrator scribing process for forming the grooves in the contact members of switches in accordance with this invention to provide a jagged surface contour in the grooves to further impede thermal conduction at the groove surfaces, as will be further discussed with reference to FIG. 7.

Figure 3:
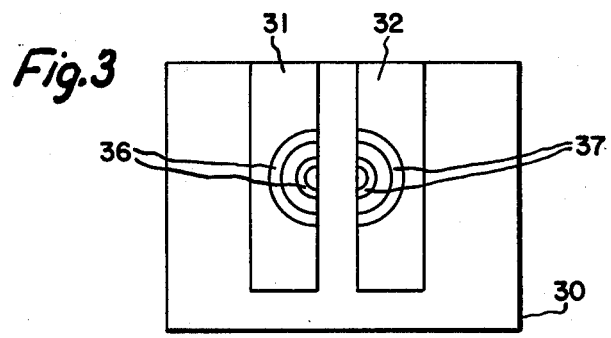
FIG. 3 is a plan view of the substrate, conductor, and contact members of a radiation switch in accordance with one embodiment of this invention.

FIG. 3 illustrates a contact configuration for a radiation switch in accordance with this invention having parallel conductors. In FIG. 3, substrate 30 has a pair of parallel conductors 31 and 32 thereon. Conductor 31 has grooves 36 and 37 therein defining the contact area of the switch over which conductor precursor material is deposited.

Figure 4:
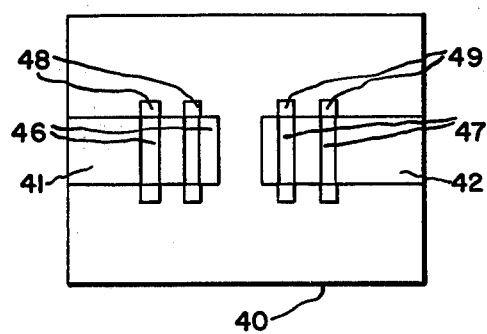
FIG. 4 is a plan view of the substrate, conductor, and contact members of a radiation switch in accordance with another embodiment of this invention.

FIG. 4 illustrates another contact configuration for radiation switches in accordance with this invention wherein substrate 40 has a pair of collinear conductor members 41 and 42 thereon and having a gap therebetween. At the facing ends of conductors 41 and 42, grooves 46 and 47 are provided respectively. The scribing of grooves 46 and 47 extrudes quantities of conductor material 48 and 49 from, respectively, conductors 41 and 42 onto substrate 40. Extruded conductor material 48 and 49 has very little mass and accordingly functions very poorly as a heat sink. Therefore, in accordance with another feature of this invention, conductive extrusions 48 and 49 are left overlying substrate 40 and are covered with conductor precursor material to further increase the area of reliable contact upon conversion of the conductor precursor material.

Figure 5:
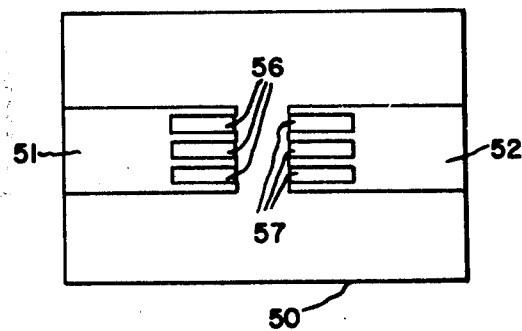
FIG. 5 is a plan view of the substrate, conductor, and contact members of a radiation switch in accordance with another embodiment of this invention.

FIG. 5 illustrates another configuration of radiation switch contacts in accordance with this invention wherein substrate 50 has collinear conductor members 51 and 52 thereon in the facing ends of which are scribed grooves 56 and 57, respectively. Grooves 56 and 57 are parallel with conductors 51 and 52 as distinguished from transverse grooves 46 and 47 as shown in FIG. 4. FIGS. 3, 4, and 5 illustrate that this invention is not limited to any particular groove orientation and other orientations are likewise within the scope of the appended claims. FIG. 5 further illustrates that in the case of chemically formed grooves, for example, conductor extrusions as illustrated in FIG. 4 are not present, or alternatively, in the case of scribed grooves, the extruded material may be removed if desired. The structure as shown in FIG. 5 provides a switch of reliable operation, however, in most cases, scribing is the preferred method for forming the grooves, and the utilization of extruded conductor material is advantageous.

Figure 6:
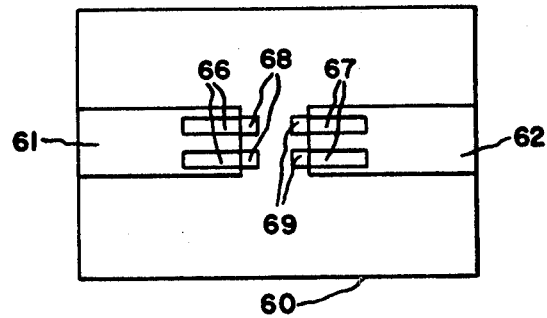
FIG. 6 is a plan view of the substrate, conductor, and contact members of a radiation switch in accordance with another embodiment of this invention.

FIG. 6 illustrates a contact configuration similar to that of FIG. 5 except that material 68, 69 extruded from conductor members 61 and 62 by the scribing of grooves 66 and 67 is left overlying substrate 60.

FIG. 7 is a magnified cross-sectional elevation view of a contact member for a radiation switch in accordance with this invention wherein conductor 71 has grooves 76 formed therein by vibrator scribing action. The use of vibrator scribing for forming grooves 76 provides grooves having a jagged surface profile. The jagged surface profile provides a large plurality of points having low mass thereby increasing the impedance to thermal conduction at the groove surfaces further decreasing the effectiveness of the contact region of conductor 71 as a heat sink.

While this invention has been described with reference to particular embodiments and examples, other modifications and variations will occur to those skilled in the art, in view of the above teachings. Accordingly, it should be understood that within the scope of the appended claims the invention may be practiced otherwise than is specifically described.

The invention claimed is:

1. A method of making a radiation switch comprising the steps of:
   applying a pair of conductors to a non-conductive substrate;
   scribing said conductors over a portion of each of said conductors to a depth sufficient to reduce heat sinking effectiveness of contact portions of said conductors; and
   depositing a quantity of conductor precursor material over said scribed portions of said conductors and a portion of said substrate therebetween.

2. The method of claim 1 wherein said scribing step is a deep scribing step to a depth exceeding one-half the thickness of said conductors.

3. The method of claim 1 wherein said scribing step is more particularly a vibrator scribing step.

4. The method of claim 1 wherein said scribing step extrudes conductive fingers from said conductors onto said substrate and said depositing step further includes depositing said conductor precursor material over said fingers.

* * * * *